(12) United States Patent
Trogolo et al.

(10) Patent No.: US 7,615,805 B2
(45) Date of Patent: Nov. 10, 2009

(54) VERSATILE SYSTEM FOR OPTIMIZING CURRENT GAIN IN BIPOLAR TRANSISTOR STRUCTURES

(75) Inventors: Joe R. Trogolo, Plano, TX (US);
Tathagata Chatterjee, Allen, TX (US);
Lily X. Springer, Dallas, TX (US);
Jeffrey P. Smith, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/745,906

(22) Filed: May 8, 2007

(65) Prior Publication Data
US 2007/0205435 A1   Sep. 6, 2007

Related U.S. Application Data

(62) Division of application No. 10/196,634, filed on Jul. 15, 2002, now Pat. No. 7,226,835.

(60) Provisional application No. 60/344,664, filed on Dec. 28, 2001.

(51) Int. Cl.
*H01L 31/0328* (2006.01)
(52) U.S. Cl. ................ 257/198; 257/197; 257/536; 257/E21.375; 257/E21.696; 438/235
(58) Field of Classification Search ......... 257/197–198, 257/565, 578; 438/235
See application file for complete search history.

(56) References Cited

U.S. PATENT DOCUMENTS

| 359,306 A | 3/1887 | Wittenberg |
| 3,582,726 A | 6/1971 | Gilbert et al. |
| 3,654,526 A | 4/1972 | Cunningham et al. |
| 3,753,774 A | 8/1973 | Veloric |
| 3,895,977 A | 7/1975 | Sanders |
| 4,719,185 A | 1/1988 | Goth |
| 4,772,567 A | 9/1988 | Hirao |
| 4,873,200 A | 10/1989 | Kawakatsu |
| 5,061,646 A | 10/1991 | Sivan et al. |
| 5,073,811 A | 12/1991 | Botti et al. |
| 5,250,838 A * | 10/1993 | Leduc .................. 257/578 |
| 5,280,190 A | 1/1994 | Lu |
| 5,610,435 A | 3/1997 | Watanabe et al. |
| 5,932,922 A | 8/1999 | Metzler et al. |
| 6,340,618 B1 * | 1/2002 | Johansson .............. 438/309 |
| 6,440,812 B2 | 8/2002 | Violette |

(Continued)

FOREIGN PATENT DOCUMENTS

DE 2044467 * 3/1972

(Continued)

*Primary Examiner*—A. Sefer
(74) *Attorney, Agent, or Firm*—Warren L. Franz; Wade J. Brady, III; Frederick J. Telecky, Jr.

(57) ABSTRACT

Disclosed are apparatus and methods for designing electrical contact for a bipolar emitter structure. The area of an emitter structure (106, 306, 400, 404) and the required current density throughput of an electrical contact structure (108, 308, 402, 406) are determined. A required electrical contact area is determined based on the required current density, and the electrical contact structure is then designed to minimize the required electrical contact area with respect to the emitter structure area.

9 Claims, 2 Drawing Sheets

U.S. PATENT DOCUMENTS

| | | |
|---|---|---|
| 6,468,871 B1 | 10/2002 | Naem |
| 6,483,170 B2 | 11/2002 | Johansson |
| 6,563,147 B1 * | 5/2003 | Ikeda .................. 257/197 |
| 6,703,647 B1 | 3/2004 | Garcia et al. |
| 6,870,242 B2 | 3/2005 | Wu |
| 2002/0149062 A1 * | 10/2002 | Nii et al. ................ 257/370 |

FOREIGN PATENT DOCUMENTS

| | | | |
|---|---|---|---|
| DE | 2044467 A | | 3/1972 |
| JP | 357015456 A | | 1/1982 |
| JP | 359219960 A | | 12/1984 |
| JP | 360010777 A | | 1/1985 |
| JP | 405235394 A | | 9/1993 |
| JP | 07066218 A | | 3/1995 |
| JP | 11040572 A | | 2/1999 |
| JP | 11-297710 | * | 10/1999 |

* cited by examiner

VERSATILE SYSTEM FOR OPTIMIZING CURRENT GAIN IN BIPOLAR TRANSISTOR STRUCTURES

This application is a divisional of application Ser. No. 10/196,634, filed Jul. 15, 2002, which claims the benefit of provisional Application No. 60/344,664, filed Dec. 28, 2001.

FIELD OF THE INVENTION

The present invention relates in general to the fabrication and operation of semiconductor devices and, more particularly, to devices and methods for optimizing current gain in semiconductor devices utilizing bipolar transistor structures.

BACKGROUND OF THE INVENTION

This application claims priority from Provisional Application Ser. No. 60/344,664, filed on Dec. 28, 2001.

The continual demand for enhanced integrated circuit performance has resulted in, among other things, a dramatic reduction of semiconductor device geometries, and continual efforts to optimize the performance of every substructure with any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, semiconductor material properties and behaviors.

Bipolar circuitry, especially that utilized in BiCMOS technologies, requires control of many electrical parameters to achieve optimal performance. Often, controlling the current gain of the bipolar transistor ($H_{fe}$) is essential to achieve desired performance levels. $H_{fe}$ is the ratio of the collector current to the base current in the bipolar transistor. Consider, for example, bipolar power output stages. Such circuitry requires maximization of $H_{fe}$ to insure adequate current to a load while maintaining an acceptable quiescent operating current. Similarly, bipolar input circuits require a minimum $H_{fe}$ to insure compliance with input impedance requirements. Maximum $H_{fe}$ limits are often determined by a technology's operational voltage requirements. Most mass production technologies are developed having 3:1 allowable $H_{fe}$ ranges (e.g., 40-120, 100-300).

In order for mass-production technologies to be cost-effective, tight parametric control of individual circuits must, to some extent, be compromised. High speed, high volume processing cannot be stopped or slowed to analyze or correct unique, design-related, parametric variations. Often, parametric variations across disparate circuit designs are not addressed during processing, and not identified until finished devices are tested or fail in use. Thus, where possible, parametric variation introduced by circuit design should be minimized.

SUMMARY OF THE INVENTION

A system that provides $H_{fe}$ optimization during circuit design, particularly for bipolar transistor structures, while comprehending peculiar physical properties and effects of small geometry manufacturing processes, is now needed. This system should decrease or eliminate $H_{fe}$ variation in bipolar transistors—providing efficient optimization and maximization of $H_{fe}$, thereby improving device switching speed and overall device performance and reliability.

Recognizing this, the present invention provides a system for optimizing $H_{fe}$ during device design. The present invention recognizes and characterizes the sensitivity of $H_{fe}$ to the ratio of emitter contact area v. emitter area. The present invention accounts for this sensitivity during design of bipolar device structures, providing a system of contact design maximizing $H_{fe}$ for a given contact area.

Specifically, the present invention provides a system that provides design of bipolar emitter structures that optimize $H_{fe}$. An emitter structure of a given area is provided. The required current density throughput of an electrical contact structure is determined. A required electrical contact area is determined based on the required current density. The ratio of the contact area to the emitter area is minimized by layout and design of the electrical contact structure. The electrical contact is then disposed upon the emitter.

BRIEF DESCRIPTION OF THE DRAWINGS

For a more complete understanding of the present invention, including its features and advantages, reference is made to the following detailed description, taken in conjunction with the accompanying drawings. Corresponding numerals and symbols in the different figures refer to corresponding parts unless otherwise indicated.

DETAILED DESCRIPTION

The present invention defines a system, comprising various structures and methods, for optimizing the current gain ($H_{fe}$) of bipolar structures during device design. The present invention comprehends the sensitivity of $H_{fe}$ to the ratio of emitter contact area v. emitter area, accounting for this sensitivity by providing a system of contact design that maximizes $H_{fe}$ for a given contact area.

It should be understood that the principles disclosed herein may be applied in a wide range of semiconductor processing applications. Specifically, the present invention may be applied to any number of situations where the current gain of diffused bipolar structures, particularly those in shallow device geometry technologies, is of concern. For purposes of explanation and illustration, however, the present invention is hereafter described in reference to an emitter structure in a BiCMOS transistor device.

As semiconductor device geometries are continually scaled downward, critical structures and features within semiconductor devices must also scale downward. Problems arise, however, when certain device structures or features become too shallow. For example, shallow emitter junctions can result in minority carrier diffusion lengths greater than the emitter junction depth (e.g., 0.5 µ±0.4 µ). Depending on the particular layout of a transistor, this phenomenon may cause lower $H_{fe}$ and, as a result, decrease device performance.

Figure 1:
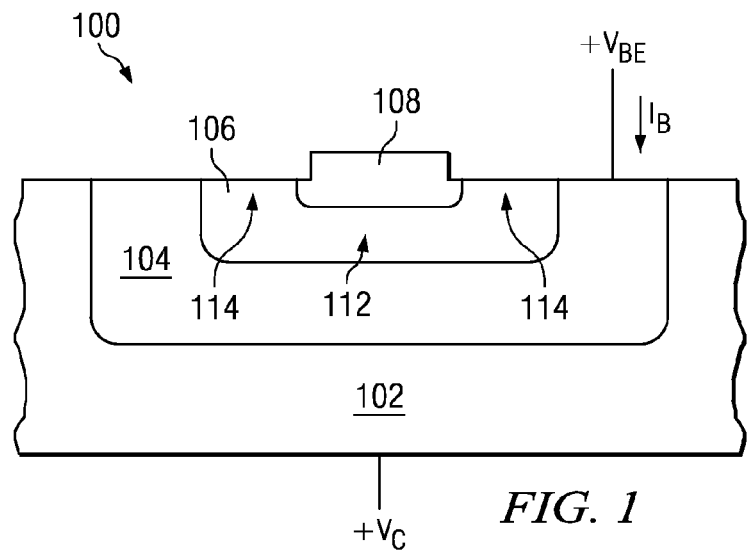
FIG. 1 illustrates a bipolar transistor structure.

Consider, for example, the device illustrated in FIG. 1. Device 100 comprises a bipolar transistor having collector 102, base 104, and emitter 106. Contact 108 is disposed atop emitter 106, usually centered thereon. Emitter contact 108 comprises any suitable electrical contact material available in the desired fabrication process, usually taking the form of some metallization. Depending upon the material composition of emitter 106 and contact 108, contact 108 might slightly alloy with emitter 106 (e.g., form a silicide), resulting in an extension of emitter contact 108 below the upper surface of emitter 106 (as depicted in FIG. 1). In forward active operation, a voltage 110, the base-to-emitter voltage ($V_{BE}$), is applied to forward bias the base-to-emitter junction and cause current to flow. Electrons are thus injected from emitter 106 into base 104, while holes are back-injected from base 104 to emitter 106 (resulting in base current $I_B$). Current gain for device 100 is given by:

$$H_{fe} = I_C/I_B,$$

where $I_c$ is the collector current. Assuming a constant collector current, maximization of $H_{fe}$ depends on minimization of $I_B$.

Focusing then on $I_B$ and related issues, the layout of contact 108 in relation to emitter 106 must be examined. Assuming that emitter 106 is a shallow geometry emitter, the distance from the base-to-emitter junction to the upper surface of emitter 106 will be well within the diffusion length of the holes back-injected into emitter 106.

Figure 2:
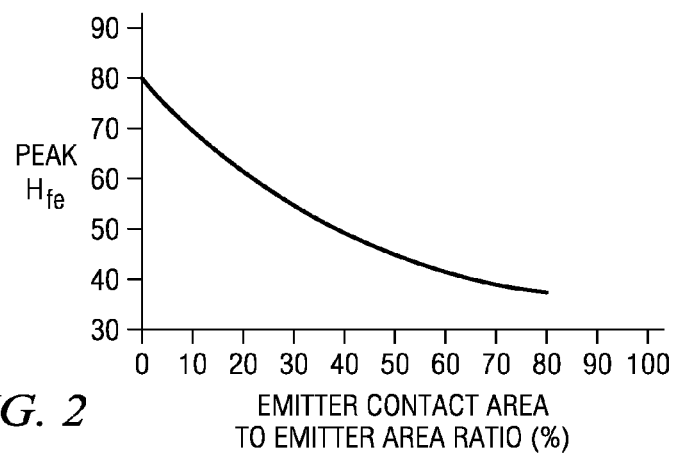
FIG. 2 depicts a graph of the relationship between $H_{fe}$ and emitter contact area v. emitter area ratio.

First, the region 112 immediately under contact 108 is considered. The metal contact 108 has infinite recombination velocity. Thus, as holes migrate across emitter 106 within region 112, the boundary condition at the junction between contact 108 and emitter 106 is zero. In contrast, the regions 114 along the upper surface of emitter 106 where there is no contact have a non-infinite recombination velocity. Thus, the boundary condition in these regions is non-zero. This results in a lower $I_B$, and higher $H_{fe}$, in the emitter areas around contact 108 than in the area directly under contact 106. Thus, emitter 106 has different electrical and performance characteristics in areas under contacts than in areas not under contacts. Effectively, two transistors of differing base current density operate in parallel, and the larger contact area to emitter area ratio results in an overall lower $H_{fe}$. If maximizing $H_{fe}$ is desirable, then minimizing the ratio of emitter contact area to overall emitter area is necessary. This is illustrated in FIG. 2, which shows a characteristic plot 200 of the relationship between peak $H_{fe}$ and the ratio of emitter contact area to overall emitter area. As FIG. 2 illustrates, maximum $H_{fe}$ occurs when the ratio is zero. Although an absolute zero ratio of emitter contact area to overall emitter area may be very difficult, if not impossible to obtain, the need to minimize the ratio remains critical to optimizing device performance.

Figure 3:
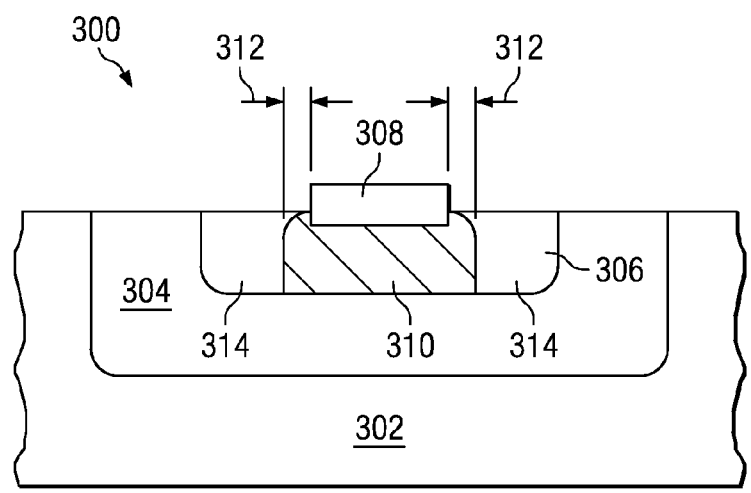
FIG. 3 illustrates a bipolar transistor structure.

The sensitivity of $H_{fe}$ to the ratio of areas must be characterized. Referring now to FIG. 3, one approach to that characterization is described. FIG. 3 illustrates a bipolar device 300. Device 300 comprises a collector 302, base 304, and emitter 306. Emitter contact 308 is disposed atop emitter 306. Base 304 is narrow, thus there is no recombination of holes in the base. Emitter 306 is shallow, thus the minority carrier diffusion length is greater than the depth of emitter 306. Within emitter 306, two distinct regions are characterized. First, region 310 is the effective contact region, comprising the area directly under contact 308, in addition to the area within a lateral minority carrier diffusion length 312 away from contact 308. Non-contact region 314 is the remaining area within emitter 306 not included within region 310. $H_{fe}$ for device 300 may be estimated by equation (1) as follows:

$$H_{fe} = \frac{(J_C)(A_E)}{(J_{BC})(A_C) + (J_{BNC})(A_{NC})} \quad (1)$$

where $J_C$ is the collector current density, $A_E$ is the emitter area, $J_{BC}$ is the base current density within region 310, $A_C$ is the area of effective contact region 310, $J_{BNC}$ is the base current density within region 314, and $A_{NC}$ is the area of effective non-contact region 314. Based on the particular performance parameters of a given device technology, $H_{fe}$ is determined as a function of contact area and emitter area and may be optimized for a given device structure.

This characterization may be carried further, providing the ability to quickly and separately characterize the components of $H_{fe}$ in the effective contact region and in the effective non-contact region for a given design technology. Equation (1) above may be rewritten as follows:

$$\frac{A_E}{(H_{fe})(A_{NC})} = \frac{(J_{BC})(A_C)}{(J_C)(A_{NC})} + \frac{J_{BNC}}{J_C} \quad (2)$$

Figure 4:
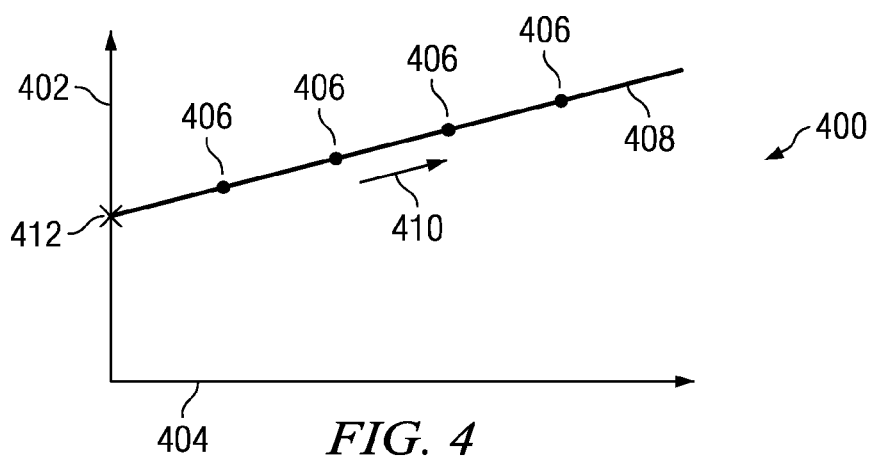
FIG. 4 illustrates an analytical plot of $H_{fe}$ components.

Plotting data for this equation yields a valuable analytical tool. For a desired design technology, $H_{fe}$ data on a number of transistors, having varying contact/non-contact ratios, is collected and evaluated using Equation (2). The results are then plotted and evaluated. An illustrative plot 400 is provided in FIG. 4. Plot 400 graphs the value of $A_E/(H_{fe})(A_{NC})$, along axis 402, as a function of the value of $(A_C)/(A_{NC})$, along axis 404. Multiple $H_{fe}$ data points 406, collected for the desired design technology, are plotted to render plot line 408. The slope 410 of line 408 equals $J_{BC}/J_C$, and the point 412 at which line 408 intercepts axis 402 equals $J_{BNC}/J_C$. $H_{fe}$ values in the effective contact region, and in the effective non-contact region, thus equal the inverse of the values of slope 410 and at point 412, respectively. In order to provide an illustrative example, assume that for a given technology X, the value of $H_{fe}$ at point 412 is determined to be 80, and the slope 410 is determined to be 0.033 (=1/30). If the desired effective $H_{fe}$ for the entire design is 80, then $(A_C)/(A_{NC})$ must equal 0. Although designing a contact of zero area is not practical, this evaluation lets the designer know that the ratio of contact area to non-contact area must be very small—as small as possible. In practice, $H_{fe}$ values are most often specified in ranges, due to the inherent production variations in most manufacturing processes. Thus, the designer may actually be able to deliver a design having an effective $H_{fe}$ range of 60 to 100, with a target of 80. The designer therefore knows that absolute minimization of the ratio of contact area to non-contact area is critical. Another design in a different process may have $H_{fe}$ requirements that yield a contact area to non-contact area ratio of, for example, 2—leaving a designer in this process values a little flexibility in his design.

Figure 5A:
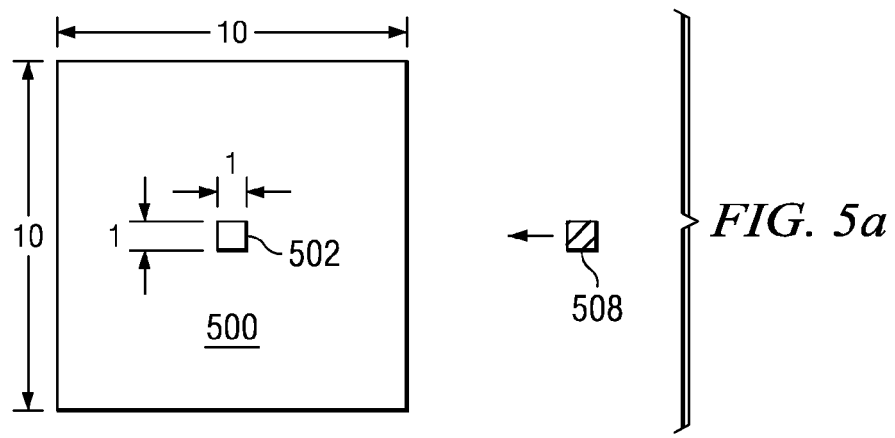
FIGS. 5a and 5b illustrate electrical contact structures.
Figure 5B:
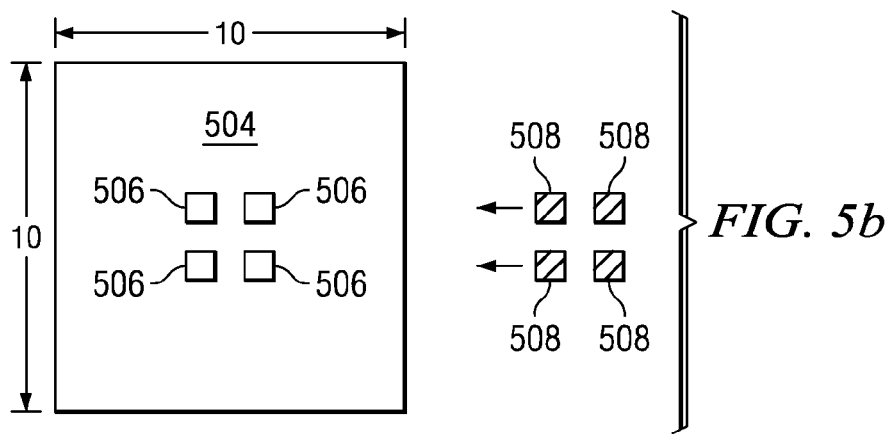

Generally, however, designing to optimize $H_{fe}$ requires a minimization of contact area on the emitter. One embodiment of the present invention, illustrated in FIGS. 5a and 5b, uses a multiple unit contact structure to address $H_{fe}$ optimization. FIG. 4a illustrates an emitter configuration having a desirable emitter contact area to emitter area ratio. Emitter 500 has unit dimensions of 10 by 10, for a total area of 100 sq. units. Emitter contact 502 has a single unit dimension, for a total area of 1 sq. unit. The area ratio is therefore 1%, yielding a relatively high $H_{fe}$. In bipolar device fabrication processes (e.g., dry etch processing), the extent to which contact 502 alloys with emitter 500 is relatively low, resulting in an effective contact region that is essentially limited to the area directly under contact 502 (i.e., one sq. unit), which tends to maximize $H_{fe}$ for this structure. In contrast, a contact substantially larger than 502 would alloy with emitter 500 to a greater extent—forming a deeper contact and a much larger effective contact area. This would greatly decrease $H_{fe}$ for the structure. In the event, however, that current density requirements dictate more than just a single unit contact, multiple unit contacts provide the required performance while optimizing the design to maximize $H_{fe}$. This is illustrated in FIG. 5b. Assume, for example, that current density requirements are four times greater than the capability of contact 502. Emitter 504 has four contacts 406, each of single unit area, evenly disposed thereon. The contacts are spaced far enough apart from one another such that the effective contact areas, if any, for the contacts will not abut or overlap. Because each of the four contacts 506 has the same individual properties as contact 502, each has an effective contact area of approximately one sq. unit. The current density demands are met with an effective contact area of approximately 4 sq. units, resulting in an area ratio of 4%.

In contrast, assume that a single contact of dimension 2 sq. units by 2 sq. units was utilized. Because of its larger area, the single contact would alloy with emitter 504 to a greater extent—forming a deeper contact and resulting in a larger effective contact area. This increases the area ratio, and decreases $H_{fe}$, noticeably. For example, even a nominal lateral extension of the effective contact area by 0.25 units in each direction results in an effective contact area of 6.25 sq. units. This yields an area ratio of 6.25%—a 56% increase over the single unit configuration in FIG. 5b that provides the same current density throughput. Thus, a design seeking to maximize $H_{fe}$ should use the single unit embodiment. The single unit configuration is readily scalable to any number of units and patterns, so that varying design requirements may be satisfied. Furthermore, as the current density requirements increase, the $H_{fe}$ optimization advantages of the single unit configuration, over single large contacts, increase.

In another embodiment of the present invention, $H_{fe}$ optimization comprises a cladding process. An emitter structure is salicided prior to disposition of a contact. Contact adhesion and electrical performance improve, resulting in increased current density for smaller contacts. As previously explained, decreased contact size results in improved $H_{fe}$. Specifically, an emitter structure is salicided using a suitable processing metal (e.g., titanium, platinum, or cobalt). The metal is deposited over the desired salicide area. The structure is then annealed, causing the metal to alloy with the emitter silicon forming a salicide 508 (shown in FIGS. 5a and 5b). The emitter contact is then disposed atop the salicided region in a desired location. Depending upon the particular processes used, and on the desired device structures, metal deposition may cover the entire emitter structure, or may be limited to a confined region. If the deposition covers the entire emitter, then the entire emitter surface will be salicided. This will reduce $H_{fe}$ for the structure. Thus, the portion of the salicided emitter surface without contact structure must be removed (e.g., etched) to optimize H.sub.fe. Alternatively, where fabrication processes are able to, emitter salicidation is limited to just the portion of the emitter surface where a contact will be disposed. Thus, the benefits of the smaller contact having higher current density is realized without requiring the extra processing to remove salicided emitter.

In another alternative embodiment, the cladding technique described above may be combined with the unit contact technique previously described to even further maximize $H_{fe}$ for a given design. Thus, unlike previous $H_{fe}$ optimization techniques (e.g., perimeter effect) that tend to diminish as device geometries grow smaller and shallower, the present invention provides versatile techniques for characterization and optimization of $H_{fe}$ that recognize the effects of shallow structures.

While this invention has been described with reference to illustrative embodiments, this description is not intended to be construed in a limiting sense. Upon reference to the description, it will be apparent to persons skilled in the art that various modifications and combinations of the illustrative embodiments as well as other embodiments of the invention can be made without departing from the spirit and scope of the invention. The structures and methods of the present invention may be employed in a number of semiconductor fabrication processes. The structures and methods of the present invention may be utilized to optimize $H_{fe}$ in any design relying on diffused emitter structures. It is therefore intended that the appended claims encompass any such

What is claimed is:

1. A bipolar emitter structure adapted to optimize $H_{fe}$, comprising:
    an emitter having a given area; and
    an electrical contact structure disposed on the emitter;
       wherein the electrical contact structure is configured to minimize a contact area between the electrical contact structure and the emitter based on an optimization function to optimize $H_{fe}$; the electrical contact structure is a single unit contact; the electrical contact structure is disposed atop the emitter structure; and the contact area between the electrical contact structure and the emitter is about 1% of the given area of the emitter.

2. the structure of claim 1, wherein the electrical contact structure is disposed atop a salicided region of the emitter.

3. The structure of claim 1, wherein the electrical contact structure is further configured to minimize contact area based on a functional parameter.

4. The structure of claim 3, wherein the functional parameter is current gain.

5. The structure of claim 3, wherein the functional parameter is current density.

6. The structure of claim 1, wherein the optimization function is $$\frac{A_E}{(H_{fe})(A_{NC})} = \frac{(J_{BC})(A_C)}{(J_C)(A_{NC})} + \frac{J_{BNC}}{J_C}.$$

7. The structure of claim 1, further comprising four electrical contact structures disposed atop the emitter structure; wherein a contact area between each electrical contact structure and the emitter is about 1% of the given area of the emitter, such that a total contact area between the four electrical contact structures and the emitter is about 4% of the given area of the emitter.

8. The structure of claim 1, wherein the electrical contact structure is a first electrical contact structure and the bipolar emitter structure further comprises a plurality of individual contacts disposed atop the emitter structure.

9. A bipolar emitter structure adapted to optimize $H_{fe}$, comprising:
    an emitter having a given area; and
    an electrical contact structure disposed on the emitter;
       wherein the electrical contact structure is configured to minimize a contact area between the electrical contact structure and the emitter based on an optimization function to optimize $H_{fe}$; the electrical contact structure comprises a plurality of single unit contacts disposed evenly atop the emitter structure; and each of the single unit contacts provides a contact area with the emitter which is about 1% of the given area of the emitter based on the optimization function.

* * * * *